(12) United States Patent
Kwa et al.

(10) Patent No.: US 7,696,083 B2
(45) Date of Patent: Apr. 13, 2010

(54) MULTI-LAYER DEVICE

(75) Inventors: Tom Kwa, San Jose, CA (US); Linh Le, San Jose, CA (US); Nina Tikhomirova, San Jose, CA (US)

(73) Assignee: Endeoco Corporation, San Juan Capistrano, CA (US)

( * ) Notice: Subject to any disclaimer, the term of this patent is extended or adjusted under 35 U.S.C. 154(b) by 0 days.

(21) Appl. No.: 11/373,520

(22) Filed: Mar. 10, 2006

(65) Prior Publication Data
US 2007/0212818 A1    Sep. 13, 2007

(51) Int. Cl.
*H01L 21/4763* (2006.01)
(52) U.S. Cl. ............................... 438/622; 257/E21.122
(58) Field of Classification Search .................. 438/113, 438/622
See application file for complete search history.

(56) References Cited

U.S. PATENT DOCUMENTS

| 6,593,651 B1 | 7/2003 | Wilner |
| 6,644,117 B1 | 11/2003 | Kueck et al. |
| 2005/0116328 A1 | 6/2005 | Oi et al. |
| 2006/0057836 A1* | 3/2006 | Nagarajan et al. ........... 438/622 |

* cited by examiner

*Primary Examiner*—Kimberly D Nguyen
*Assistant Examiner*—Tony Tran
(74) *Attorney, Agent, or Firm*—Paul Davis; Goodwin Procter LLP

(57) ABSTRACT

A multi-layer device is provided for connecting to an electrical unit enclosed within the multi-layer device. A first wafer has a first outer terminal and a second outer terminal with etch pits. A first insulator has a first surface bonded to the first wafer and a first inner terminal located on an opposing second surface. A second wafer has a first surface bonded to the second surface of the first insulating layer and includes a pillar electrically connected to the first wafer. A second insulator has a first surface bonded to a second surface of the second wafer and a second inner terminal located on the first surface of the second insulator. The first outer terminal is electrically connected to the first inner terminal, and the second outer terminal is electrically connected to the second inner terminal. The first and second outer terminals are adapted for connecting to an electrical unit. A reinforcement is positioned adjacent to at least one of the first and second outer and, inner terminals to provide for reinforcement of the at least one of the first and second outer and inner terminals.

16 Claims, 9 Drawing Sheets

MULTI-LAYER DEVICE

BACKGROUND OF THE INVENTION

1. Field of the Invention

This invention relates generally to multi-terminal, multi-layer devices, and more particularly to multi-terminal, multi-layer devices, which can withstand greater mechanical shocks or mechanical loads to their terminals.

2. Description of the Related Art

In certain applications, electrical devices or sensors are used to measure or detect various operating or performance parameters such as, for example, temperature, pressure, or acceleration. These devices can be actuators or electronic devices such as magnetic field sensors. Typically, the electrical functions of the devices are communicated to support electronics and/or some recording apparatus that allows an operator to monitor the parameters being measured by the sensors. In many instances, the device is provided with terminals, which are simply connected to lead wires extending from the support electronics or recording apparatus.

Some electronic devices are made of multiple layers of semiconductor material. These devices or sensors typically include an interior operating unit. The electrical function of the unit may occur at various layers of the device, which must be connected, to the external electronics. For example, lead wires may be connected to interior terminals on one or more surfaces of the interior operating unit, and then fed through access holes in the layers to the outside of the device. However, when electrical functions are communicated from surfaces on opposite sides, for example, an upward and a downward surface, of the interior operating unit, wiring to the unit becomes inconvenient during the assembly process.

Some assembly processes use a "flip-chip" technique in which the inner terminals of the interior operating unit are presented on one surface. Patterns of conductor lines extend from the inner terminals up an insulated surface of a semiconductor layer that is adjacent to the interior operating unit to an outer surface of the semiconductor layer. It has been proposed to electrically connect the interior operating unit to the outside by using metal thin films that coat oxide-insulated holes of semiconductor layers positioned next to the interior operating unit. Such connections, however, introduce large capacitance coupling which can be troublesome, for example, for systems working at radio frequencies. Furthermore, extending the conductor lines through several layers is not easily accomplished.

There is a need to provide an improved multi-terminal, multi-layer device. There is a further need to provide an improved multi-terminal, multi-layer device, which can withstand greater mechanical shocks or mechanical loads to its terminals.

SUMMARY

Accordingly, an object of the present invention is to provide an improved multi-terminal, multi-layer device.

Another object of the present invention is to provide a multi-terminal, multi-layer device that can withstand greater mechanical shocks or mechanical loads to its terminals.

Yet another object of the present invention is to provide a multi-terminal, multi-layer device with reinforcements positioned adjacent to delicate terminals.

Another object of the present invention is to provide a multi-terminal, multi-layer device with improved electrical insulation of its terminals.

A further object of the present invention is to provide a multi-terminal, multi-layer device with a reduced chance of contamination and a reduced potential of electrical shorts between terminals.

These and other objects of the present invention are achieved in a multi-layer device for connecting to an electrical unit enclosed within the multi-layer device. A first wafer has a first outer terminal and a second outer terminal. A first insulator has a first surface bonded to the first wafer and a first inner terminal located on an opposing second surface. A second wafer has a first surface bonded to the second surface of the first insulating layer and includes a pillar electrically connected to the first wafer. A second insulator has a first surface bonded to a second surface of the second wafer and a second inner terminal located on the first surface of the second insulator. The first outer terminal is electrically connected to the first inner terminal, and the second outer terminal is electrically connected to the second inner terminal. The first and second outer terminals are adapted for connecting to an electrical unit. A reinforcement is positioned adjacent to at least one of the first and second outer and inner terminals to provide for reinforcement of the at least one of the first and second outer and inner terminals.

In another embodiment of the present invention, a multi-layer device has a first wafer with a first outer terminal and a second outer terminal. A first insulator has a first surface bonded to the first wafer and a first inner terminal located on a second surface. A second wafer includes a first surface bonded to the second surface of the first insulating layer and has a pillar electrically connected to the first insulator. A second insulator has a first surface bonded to a second surface of the second wafer and a second inner terminal located on that first surface. A third wafer has a cap electrically connected to the second insulator. An electrical unit is positioned between the first wafer and the third wafer and is electrically connected to the first and second inner terminals. A reinforcement is positioned adjacent to at least one of the first and second inner and outer terminals to provide for reinforcement of the at least one of the first and second inner and outer terminals.

In another embodiment of the present invention, a multi-layer device includes a first wafer with a first outer terminal and a second outer terminal. An interior operating unit has a first inner terminal electrically connected through the first wafer to the first outer terminal, and a second inner terminal electrically connected through the first wafer to the second outer terminal. A third wafer is provided. The interior operating unit is hermetically sealed between the lid and the third wafer. A reinforcement is positioned adjacent to at least one of the first and second outer terminals to provide for reinforcement of the at least one of the first and second outer terminals.

DETAILED DESCRIPTION OF THE INVENTION

Figure 1:
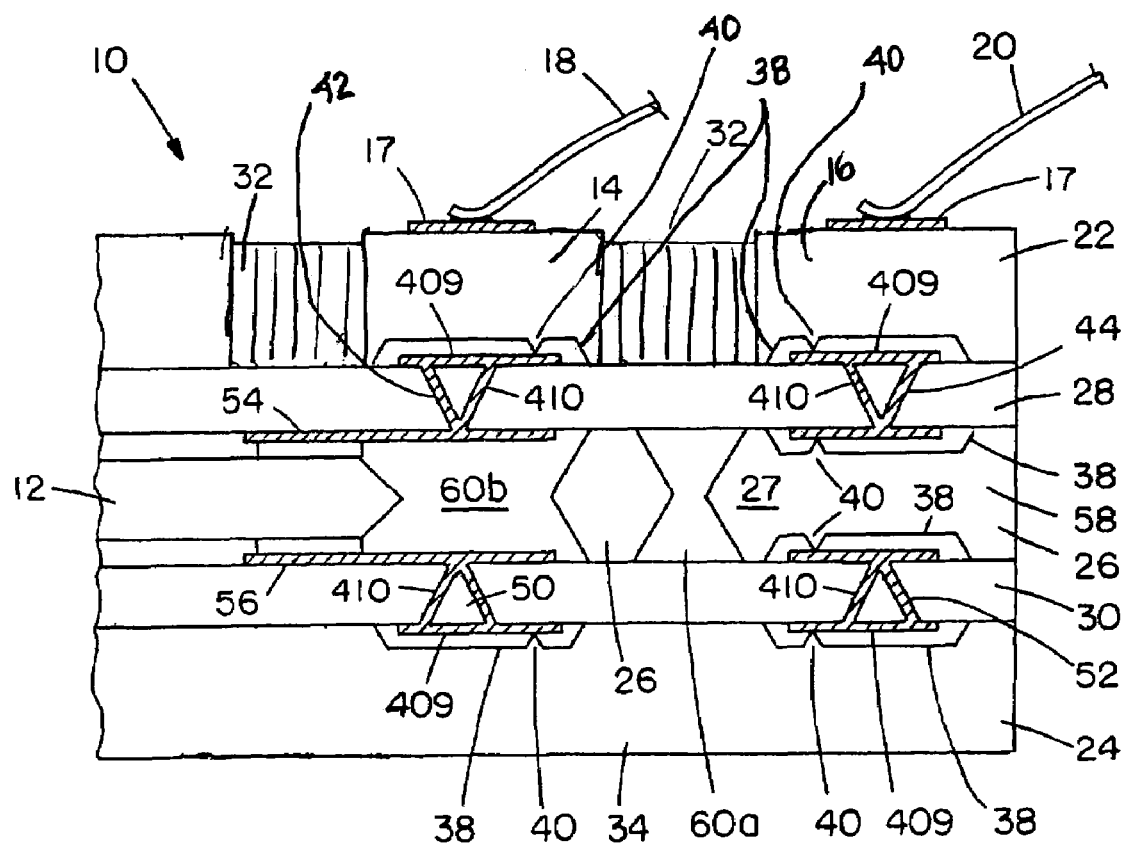
FIG. 1 is a cross-sectional view of a multi-layer silicon device with terminals in accordance with the invention.
Figure 2A:
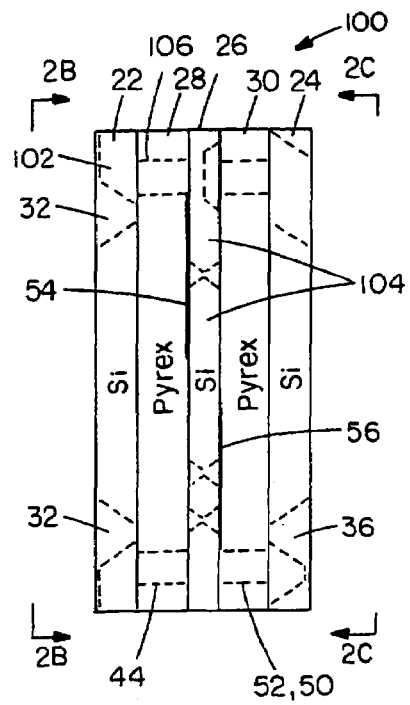
FIG. 2A is a side view of a multi-layer silicon device with internal terminals connected to an electrical unit enclosed within the device in accordance with the invention.
Figure 2B:
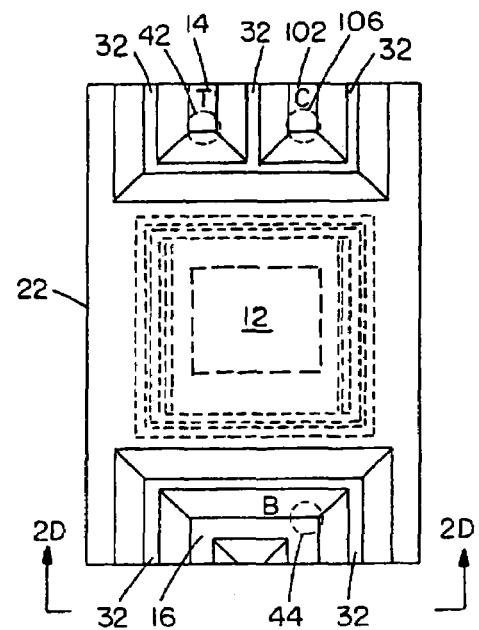
FIG. 2B is a top view of the device along the line 2B-2B of FIG. 2A.
Figure 2C:
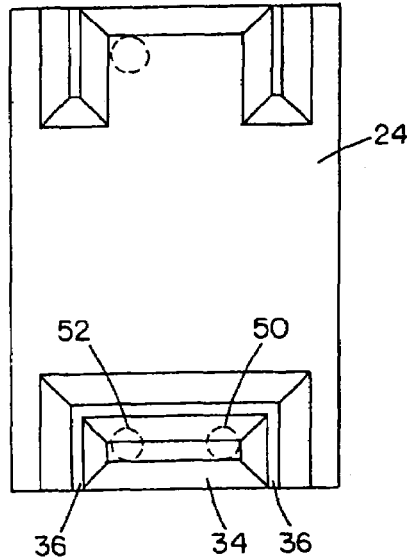
FIG. 2C is a bottom view of the device along the line 2C-2C of FIG. 2A.
Figure 2D:
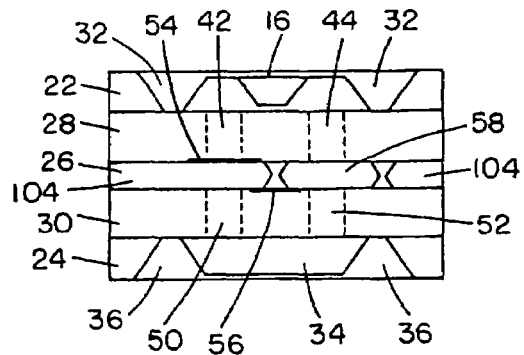
FIG. 2D is an end view of the device along the line 2D-2D of FIG. 2B.
Figure 3A:
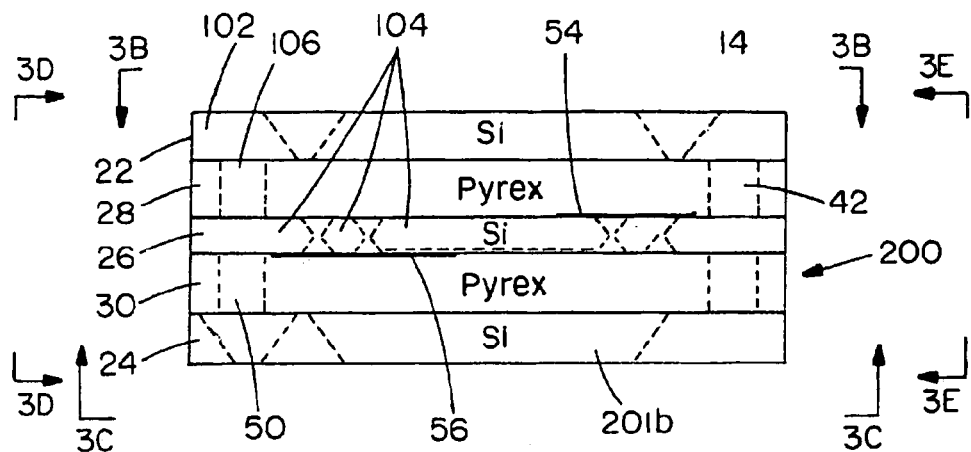
FIG. 3A is a side of an alternative embodiment of the multi-layer silicon device with internal terminals in accordance with the invention.
Figure 3B:
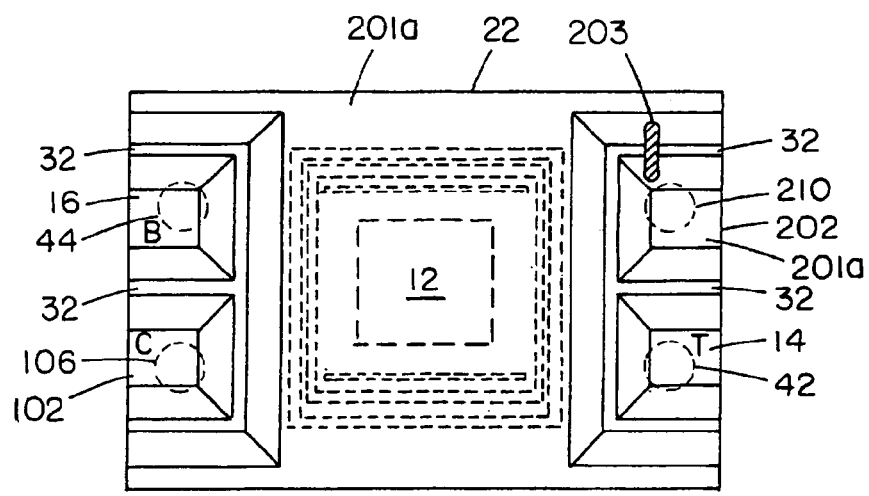
FIG. 3B is a top view of the device along the line 3B-3B of FIG. 3A.
Figure 3C:
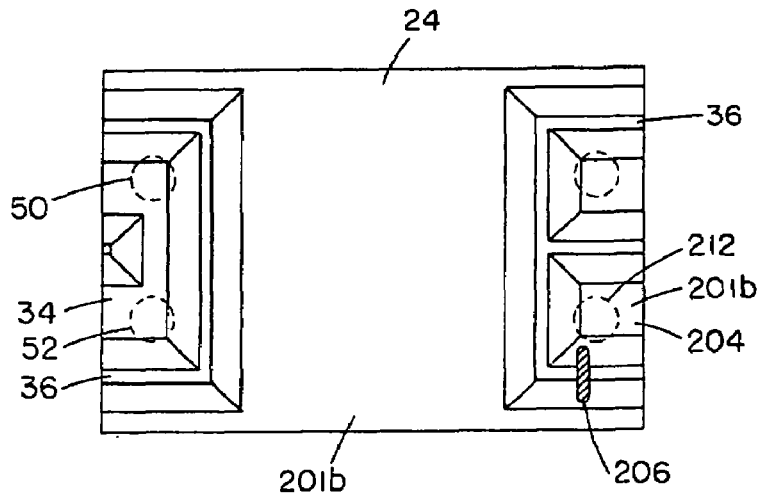
FIG. 3C is a bottom view of the device along the line 3C-3C of FIG. 3A.
Figure 3D:
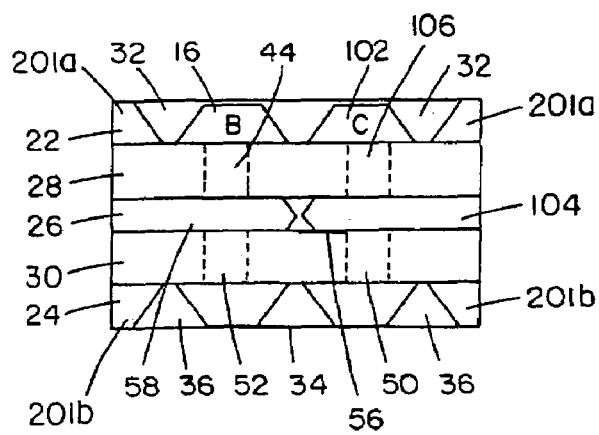
FIG. 3D is an end view of the device along the line 3D-3D of FIG. 3A.
Figure 3E:
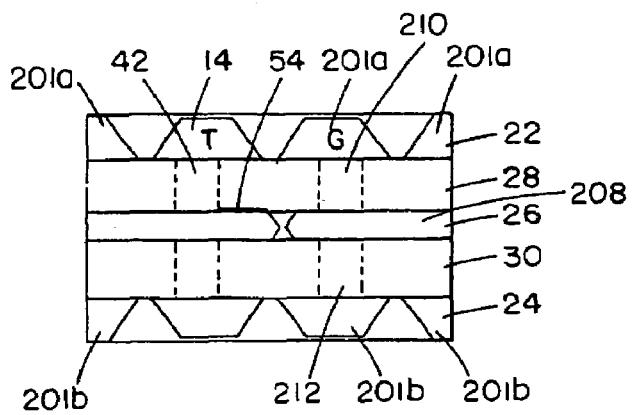
FIG. 3E is an end view of the device along the line 3E-3E of FIG. 3A.
Figure 4A:
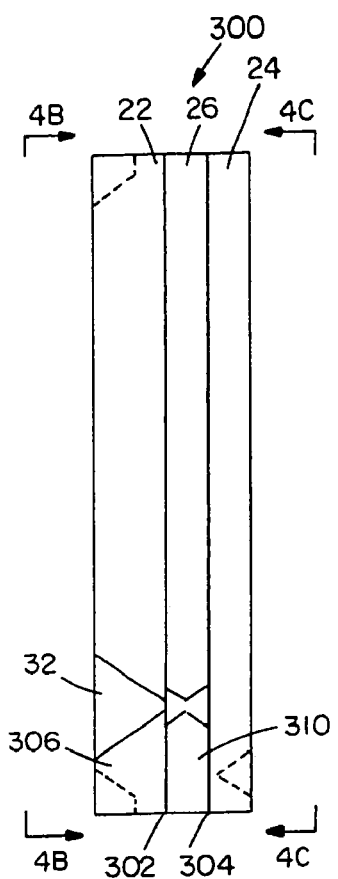
FIG. 4A is a side view of another alternative embodiment of the multi-layer silicon device with internal terminals in accordance with the invention.
Figure 4B:
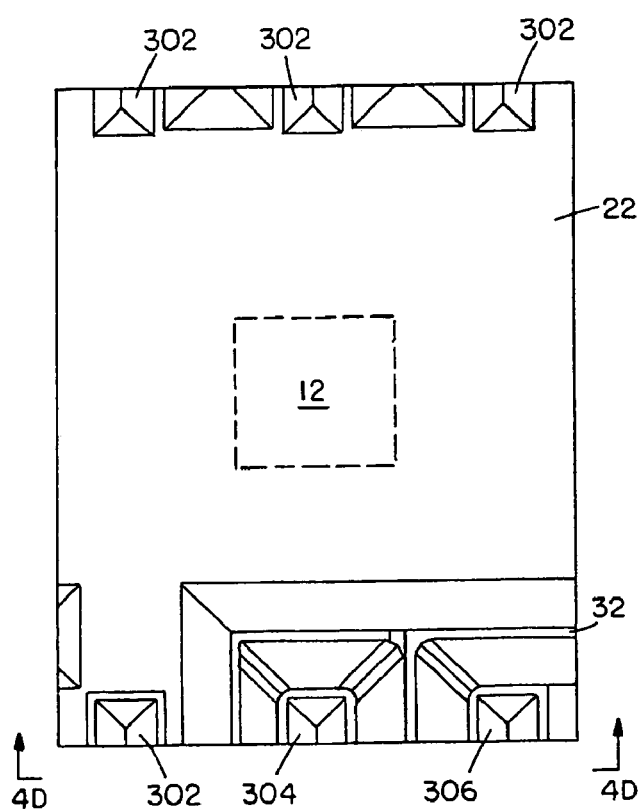
FIG. 4B is a top view of the device along the line 4B-4B of FIG. 4A.
Figure 4C:
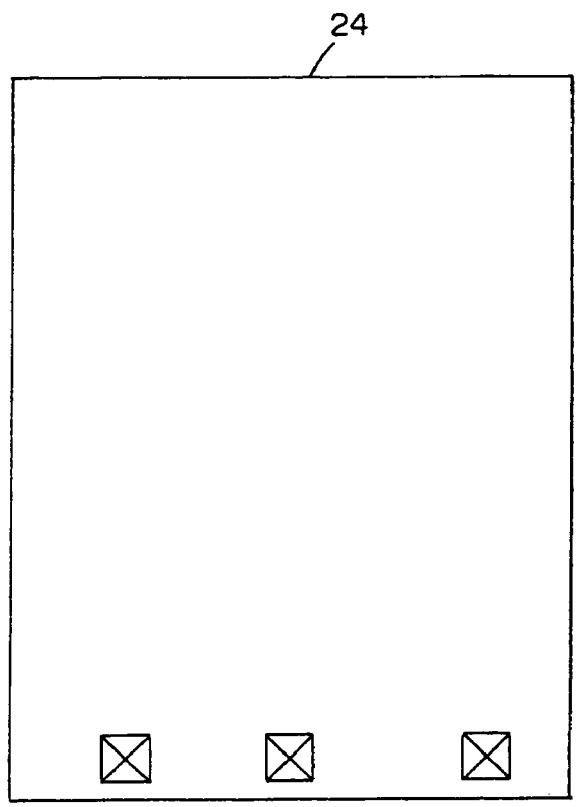
FIG. 4C is a bottom view of the device along the line 4C-4C of FIG. 4A.
Figure 4D:
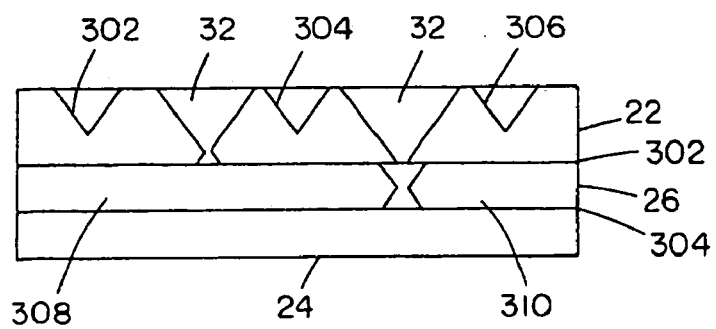
FIG. 4D is an end view of the device along the line 4D-4D of FIG. 4B.

Referring to FIG. 1, one embodiment of a two-terminal multi-layer device 10 of the present invention is shown which can enclose an interior electrical unit 12. The multi-layer device 10 can be a sensor to measure, for example, temperature, pressure, or acceleration. The multi-layer device 10 can also be used as an actuator or as some other electronic device such as a magnetic field sensor. Electrical signals are transmitted to and from the interior unit 12 to the outside of the multi-layer device 10 through the two outer terminals 14 and 16 that are coated with a thin layer of metal 17.

The metal layer 17 on each outer terminal 14 and 16 can be connected, for example, to a pair of lead wires 18 and 20, respectively, which extend to a monitor, recording apparatus, and/or support electronics. A particular feature of the multi-layer device 10 is that the interior unit 12 can be hermetically sealed within the multi-layer device 10 to protect the interior unit 12 from the outside environment.

The multi-layer device 10 can include a first wafer 22, a third wafer 24, and a second wafer 26 made from, for example, silicon. The first wafer 22 and the third wafer 24 are each bonded to an outer surface of a respective layer of Pyrex 28 and 30, or any other suitable insulating material, while the inner surfaces of the Pyrex layers 28 and, 30 are bonded to the opposite sides of the second wafer 26.

The outer terminals 14 and 16 are essentially isolated islands separated physically and electrically from the remainder of the first wafer 22 by a set of trenches 32. The third wafer 24 has a cap 34.

As illustrated in FIG. 1, a reinforcement can be included in the trenches 32 to provide reinforcement for at least a portion of the outer terminals 14, 16, as well any other terminals on the outer surface of wafer 22, as well as any other terminals on an outer surface of other wafers that are exposed to potential damage from mechanical or other forces, collectively "the "Terminals". The reinforcement is at least a partial encapsulation of the Terminals in order to provide the reinforcement and reduce damage to the Terminals from mechanical and other forces. The reinforcement also reduces mechanical loads to the Terminals.

The reinforcement can also provide improved electrical insulation of at least a portion of the Terminals. Further, the reinforcement can also reduce a chance of contamination and a reduced potential of electrical shorts between the Terminals.

The reinforcement can be made of an insulator, including but not limited to, glass, polymers and the like. The reinforcement can have the following dimensions, 25-500 microns as a width in the trench 32 itself, and at least 50% and not more than 100% of the first wafer 22 in height, but does not cover the top surface of the Terminals.

Optionally, each of the terminals 14 and 16 has a recessed region 38 provided with a protrusion 40. The protrusions 40 of the terminals 14 and 16 are in electrically contact with a first etch pit 42 and a second etch pit 44 of the Pyrex layer 28, respectively. The cap 34 and the second wafer 26 are also provided with the recessed regions 38 and protrusions 40 such that the cap 34 is electrically connected to a first etch pit 50 and a second etch pit 52 of the second layer of Pyrex 30, while a portion of the second wafer 26 is electrically connected to the, second etch pit 44 of the Pyrex layer 28, and the second etch pit 52 of the second Pyrex layer 30.

The first etch pits 42 and 50 are further electrically connected to a pair of inner thin-film terminals 54 and 56 that coat the inner surfaces of the layers of Pyrex 28 and 30, respectively. The protrusions 40 ensure a controlled area of contact between the etch pits and the adjacent layer of silicon. Alternatively, the terminals 14 and 16, the second wafer 26, and the cap 34 do not have a recessed region. Rather, they can be in direct contact with a respectively layer Pyrex. For example, there is shown in FIG. 5F an outer terminal without a recessed region.

Accordingly, when the multi-layer device 10 is assembled, there is an electrical path from the first terminal 14 through the first etch pit 42 of the Pyrex layer 28 to the inner terminal 54. There is also a second electrical path from the second terminal 16 through the second etch pit 44 of the Pyrex layer 28.to a pillar 58 of the second wafer 26. The pillar 58 is electrically isolated from the remainder of the second wafer 26 by a gap 60 so that the second electrical path continues through the second etch pit 52 of the Pyrex layer 30, across the cap 34, up the first etch pit 50 of the Pyrex layer 30, and finally to the terminal 56.

With the inner terminals 54 and 56 connected to the interior unit 12 which is electrically isolated from the second wafer 26 by a gap 60b, electrical signals to and from the interior unit 12 are communicated to the outside of the multi-layer device 10 via the outer terminals 14 and 16.

The first wafer 22, third wafer 24, and second wafer 26 and the two layers of Pyrex 28 and 30 are each about 0.4 mm thick, and the multi-layer device 10 itself is about 2 mm thick, 2.5 mm long, and 1 mm wide. The thin layer of metal 17 on each of the terminals 14 and 16 is made from any suitable conductive material such as, for example, gold or platinum, and has a thickness of about 1 micron. The etch pits 42, 44, 50, and 52 are also coated with a thin layer of metal of about 1 micron which makes the electrical connection through the respective layer of Pyrex 28 and 30, and the inner terminals 54 and 56 are about 0.75 micron thick. As with the terminals 14 and 16, the metal for the etch pits 42, 44, 50, and 52 and the inner terminals 54 and 56 can be made any suitable conductive material such as gold or platinum. The metal for etch pits 42, 44, 50, and 52 can also be a base metal such as aluminum.

The embodiment shown in FIG. 1 is a two-terminal device. However, other embodiments can be used to enclose the interior unit 12. For example, there is shown in FIGS. 2A-2D a three-terminal multi-layer device 100 that is made of the three silicon layers, the first wafer 22, the third wafer 24, and the second wafer 26, as well as the two insulating layers of Pyrex 28 and 30.

Similar to the multi-layer device 10 shown in FIG. 1, the multi-layer device 100 is provided with two outer terminals 14 and 16 which are electrically isolated from the rest of the first wafer 22 by a set of trenches 32. Accordingly, there is an electrically conductive path from the first terminal 14 to the inner terminal 54 through the etch pit 42 of the layer of Pyrex 28, and another conductive path from the second terminal 16 through the second etch pit 44 of the Pyrex layer 28 to the pillar 58 of the second wafer silicon layer 26, and then from the pillar 58 through the second etch pit 52 of the second layer of Pyrex 30, across the cap 34 electrically isolated from the remainder of the first wafer 30 by the trenches 36, up the first etch pit 50 of the Pyrex layer 30, and to the inner terminal 56 that coats the inner surface of the Pyrex layer 30. Typically, the regions of the second wafer 26 adjacent the inner terminals 54 and 56 are recessed so that those regions are not in direct contact with the inner terminals 54 and 56.

The multi-layer device 100 also includes a third terminal 102 electrically isolated from the first wafer 22 by the trenches 32 and coated with a thin layer of metal such as the metal layer 17 shown in FIG. 1. In this embodiment, a portion 104 of the second wafer 26 functions as a third inner terminal. The portion 104 includes all of the second wafer layer 26 except that which is isolated as the pillar 58, and is electrically connected to the third terminal 102 of the first wafer 22 through a third etch pit 106 of the Pyrex layer 28. Hence, with the multilayer device 100, electrical functions to and from the interior unit 12 are transmitted between the three inner terminals 54, 56, and 104 connected to the interior unit 12 and the outside of the multi-layer device 100 via the outer terminals 14, 16, and 102 along the respective conductive paths between the inner terminals and the outer terminals. Additionally, the region of the first wafer 22 isolated from the outer terminals 14, 16, and 102 can serve as another terminal, for example, by providing that region with its own metal film terminal. Similarly, the third wafer 24 that is isolated from the cap 34 can also serve as an additional terminal by making connections to that isolated portion with a metal film terminal.

Referring now to FIGS. 3A-3E, there is shown a four-terminal device 200. As with the multi-layer device 100, the device 200 includes three outer terminals 14,16, and 102 connected along a respective conductive path to the three inner terminals 54, 56, and 104, the paths being identically labeled to those shown in FIGS. 2A-2D. However, in this configuration, the first wafer 22 includes a fourth terminal 202. Although the fourth terminal 202 is isolated from the rest of the first wafer 22 by the trenches 32, there is a metal film connector 203 that electrically connects the fourth terminal 202 to the portion 201a. Similarly, the third wafer 24 includes a terminal 204, isolated by the trenches 36, electrically connected to the portion 201b of the first wafer with a connector 206. Further, there is an electrical path from the first wafer 22 to a second pillar 208 of the second wafer 26 through a fourth etch pit 210 of the Pyrex layer 28, and from the second pillar 208 to the third wafer 24 via a third etch pit 212 of the Pyrex layer 30. Thus, the portion 201a and the outer terminal 202 of the first wafer 22 is electrically connected to the portion 201b and the outer terminal 204 of the third wafer 24 such that they serve as guard electrodes.

In other embodiments, rather than using layers of Pyrex to insulate the third wafer 22, the first wafer 24, and the second wafer 26 from each other, other types of insulators can be used. For instance, there is shown in FIGS. 4A-4D a three-terminal device 300 with the third wafer 22 separated from the second wafer 26 by a thin oxide layer 302, while the first wafer 24 is separated from the second wafer 26 by a second thin oxide layer 304. In this embodiment, the oxide layers 302 and 304 are made of $SiO_2$, for example, and have a thickness of about 1.2 to 1.4 microns.

The first wafer 22 of the device 300 is provided with a set of outer terminals 302 and two other outer terminals 304 and 306. The terminals 304 and 306 are islands separated from the rest of the first wafer 22 by the trenches 32, while the terminals 302 are electrically connected across the rest of the first wafer 22. That is, the entire portion of the first wafer 22 isolated from the terminals 304 and 306 function as a terminal.

The second wafer 26 is provided with a portion 308 and a pillar 310. The portion 308 is electrically continuous throughout the second wafer 26 except for the isolated pillar 310, and includes a sealed rim that surrounds the interior unit 12. The oxide layer between the terminal 304 and the portion 308 is interrupted with a metal film to provide a conductive path between the terminal 304 and the portion 308. Hence, the portion 308 functions as an inner terminal, which is electrically connected to the terminals 304. In addition, the layer of oxide on either side of the pillar 310 is interrupted with a respective metal film such that there is a conductive path from the terminal 306 through the pillar 310 to the first wafer 24 themselves. The interior unit 12 is directly connected to the outer terminal 302, as well as the portion 308, and the first wafer 24, and hence to the terminals 304 and 306, respectively.

Referring now to FIGS. 5A-5F, there is shown a sequence of illustrated steps to fabricate an etch pit through a layer of Pyrex such as the layer 28. First (FIG. 5A), the Pyrex layer 28 is bonded to a layer of silicon, for example, the third wafer 22, by anodic bonding. This bonding process uses heat and electricity, and optionally pressure, so that an electrical charge attracts the Pyrex to the silicon and the physical contact between the two layers causes a chemical reaction with the Pyrex. At the interface, the Pyrex is reduced and the silicon is oxidized. The newly formed oxide is as adherent to the silicon as thermally grown oxide, and is continuous with the Pyrex.

Figure 5A:
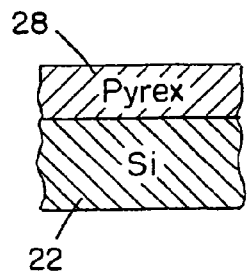
FIGS. 5A-5F are schematics of a sequence of steps to fabricate an etch pit of the devices in accordance with the invention.
Figure 5B:
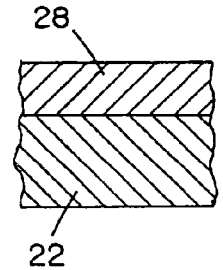
Figure 5C:
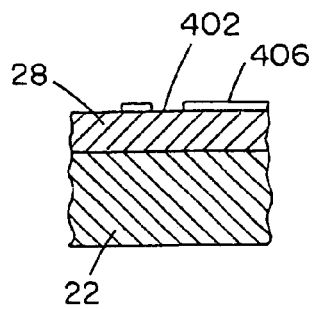

As shown in FIG. 5B, the Pyrex 28 is optionally polished to clean its outer surface. Subsequently, as illustrated in FIG. 5C, a metal layer 406 is applied to this surface, and a photochemical etching process is used to create the desired pattern with the appropriate openings 407.

Figure 5D:
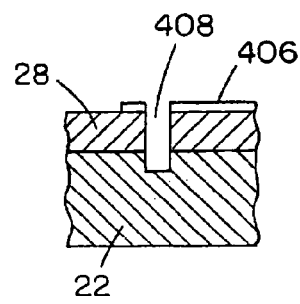

An impact grinder is used to pierce the Pyrex 28, through the openings 407, as in FIG. 5D, to create the holes 408. The impact grinder is an ultrasonic tool shaped with protrusions located where holes in the Pyrex are desired. The impact grinder uses ultrasonic vibrations to grind the Pyrex into slurry that is flushed away.

Figure 5E:
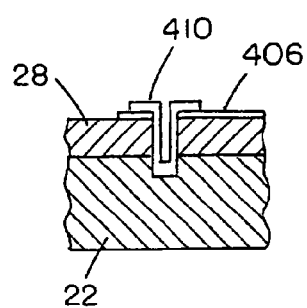
Figure 5F:
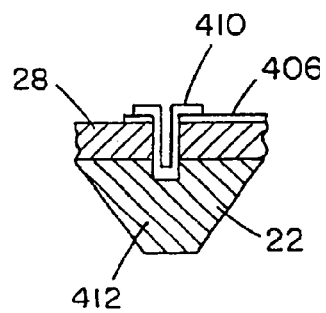

Another layer of metal 410 is applied to electrically connect the first layer of metal 407 to the first wafer 22 as illustrated in FIG. 5E. Finally another photochemical etching process is used to create the isolated islands 412, which serve as the terminals of the first wafer 22, FIG. 5F.

In other embodiments, the layer of Pyrex is preformed with the desired holes before it is bonded to the layer of silicon, and then after the bonding process, the layer of metal is applied to make the electrically connection from one side of the Pyrex to the other side of the Pyrex adjacent to the layer of silicon. As shown in FIGS. 5D through 5F, the hole 408 of the etch pit is cylindrical. Alternatively, the holes can have a conical shape, for example, as shown in FIG. 1. The conical holes for the etch pits 42, 44, 50, and 52 can be produced with a photochemical etching process. The surface of the holes are then coated with the metal layer 410 to electrically connect to a layer of metal 409 in contact with the protrusions 40.

Figure 7:
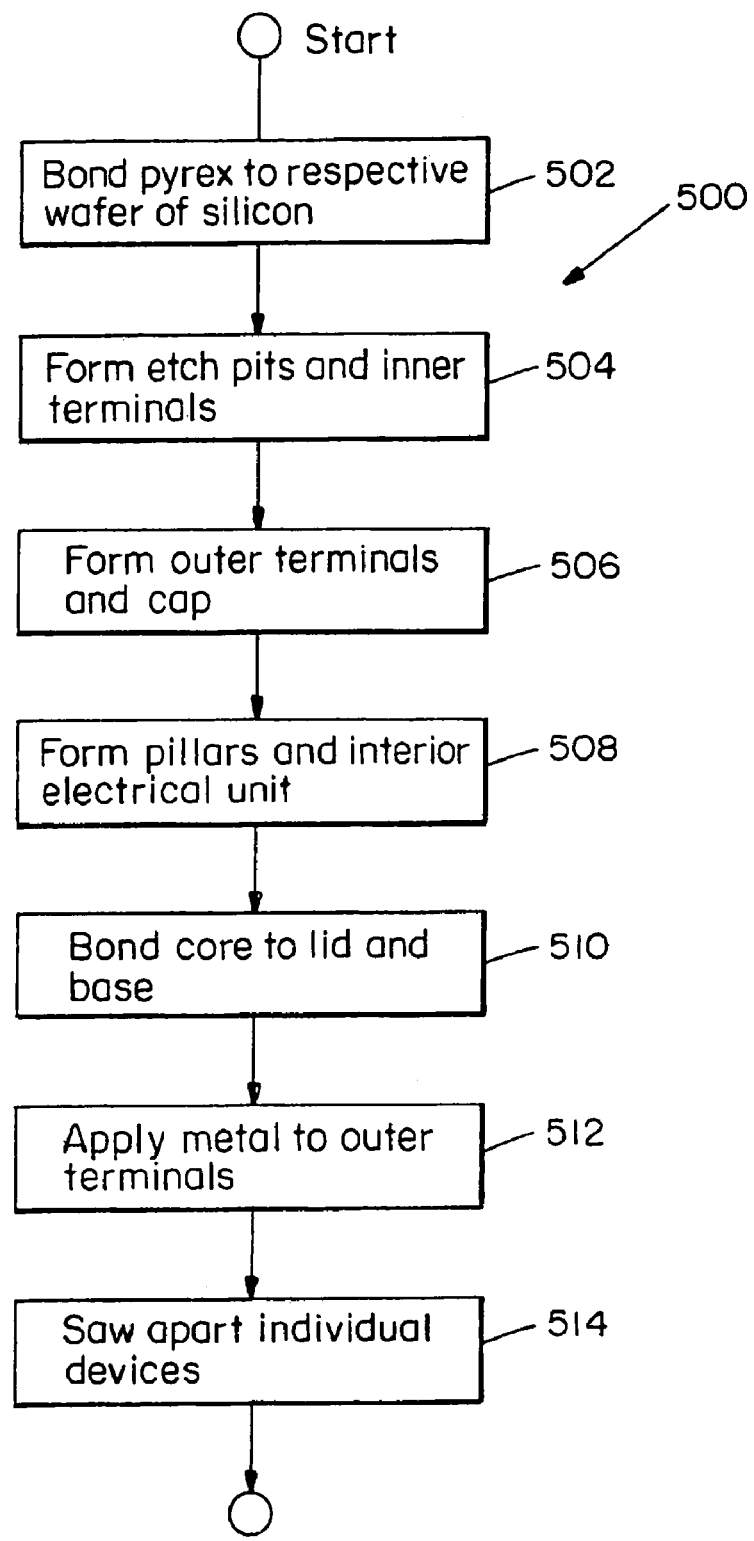
FIG. 7 is a flow diagram of a sequence of steps to fabricate the device in accordance with the invention.

Referring now to FIG. 7, there is shown a flow diagram of a sequence of steps 500 to make the devices 10, 100, or 200.

First, in a step 502, a wafer of Pyrex is bonded to a wafer of silicon from which the first wafer 22 or the third wafer 24 are formed. Next, in a step 504, the etch pits are formed as described earlier. The desired holes in the wafers of Pyrex can be preformed or they can be made with the ultrasonic grinding process described above. In addition, a layer of metal is applied to the inner surfaces of the Pyrex wafers to form the inner terminals 54 and 56.

Then, in a step 506, the silicon wafers are put through a photochemical etching process to form the outer terminals in the first wafer 22 or the third wafer 24, as well as the cap 34 of the third wafer 24.

Subsequently, in a step 508, another photochemical etching process is used to form the appropriate pillars of the second wafer 26 from another wafer of silicon. The interior operating unit 12 is also fabricated during this step.

Next, in a step 510, the second wafer 26 is bonded to the two layers of Pyrex 28 and 30. Then, in a step 512, metal is selectively applied to the outer terminals.

Finally, in a step 514, the desired device is sawed or cut away from the rest of the silicon and Pyrex wafers. Note, that typically about 40 to 1000 individual devices can be formed from these wafers. That is, each of the devices is essentially a die in the wafers during the fabrication process. Although the pillars are originally projections from a neighboring die, the sawing process cuts the pillar free from the neighbor thereby forming the isolated pillars of the individual devices bonded only to adjacent layers of that particular device.

Figure 6:
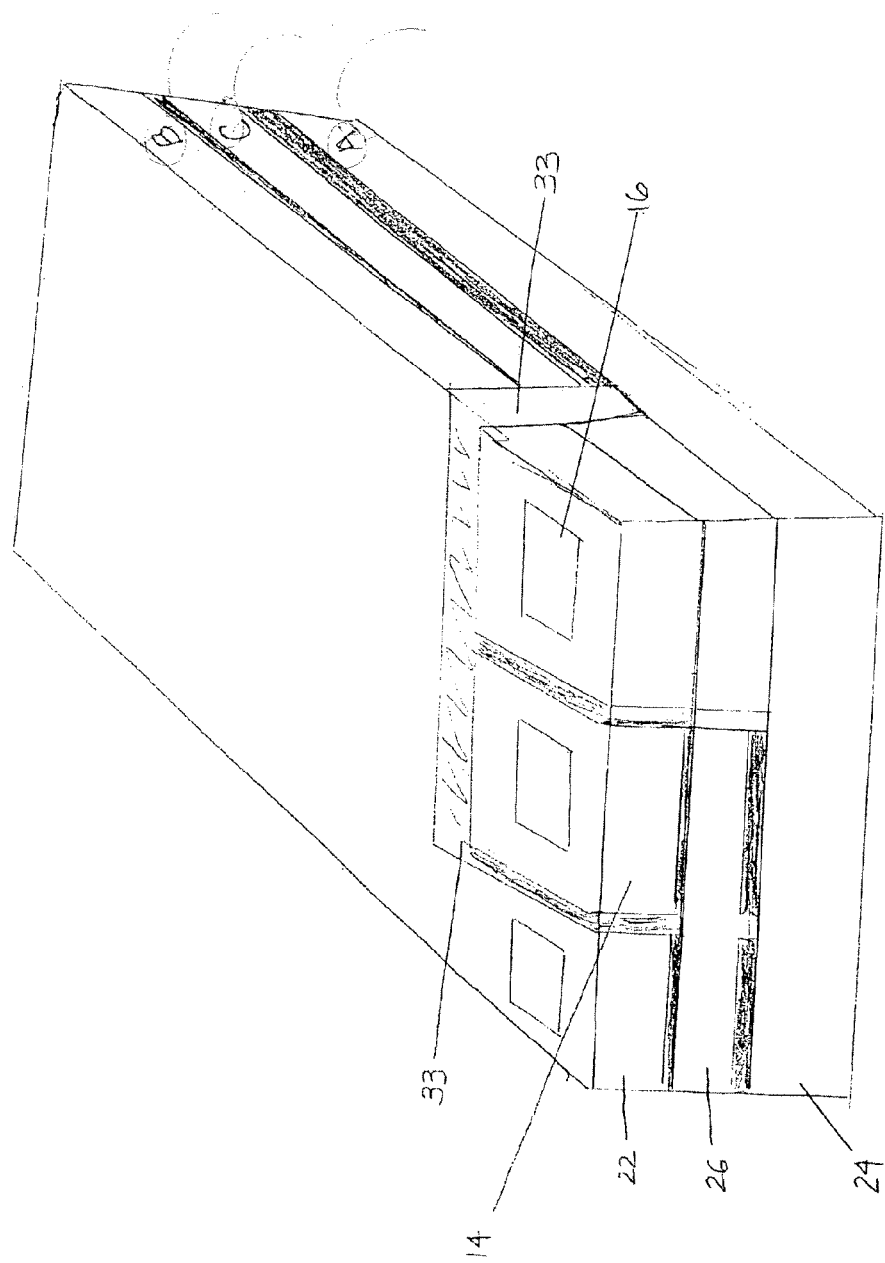
FIG. 6 is a perspective view of the device of FIG. 1 with a mechanical reinforcement positioned in a surrounding relationship to the terminals.

The process to form the device 300 shown in FIGS. 4A-4D is somewhat different than that illustrated in FIG. 6. To fabricate the device 300, the oxide layers 302 and 304 are first applied to the respective layers of silicon, which ultimately form the first wafer 22 and the third wafer 24. Then, a third wafer of silicon is subjected to a photochemical etching process to form the pillar of the second wafer 26. The first wafer 22 is also etched to form the isolated regions in the first wafer 22, which serve as the outer terminals. Subsequently, the first water 22, the third wafer 24, and the second wafer 26 are bonded together with a solder bonding process. That is, a metal film, such as, for example, a gold film, is applied only where a conductive path is desired between the various layers. Upon being heated, this film layer melts and sticks or fuses to the layers, thereby bonding the layers together. Finally, the conductive metal layer 17 is applied to certain isolated regions of the first wafer 22 to metalize the outer terminals.

The following process can make the reinforcement:

The first wafer 22 is first etched on a side to a desired depth that is no more than 90% of the thickness of the first wafer 22.

The etched first wafer 22 is then filled with the material of the reinforcement and then polished to make it planar. The first wafer 22 is then bonded to the second wafer 26. A second etch is then performed on the opposite side of the first wafer 22.

While this invention has been particularly shown and described with references to preferred embodiments thereof, it will be understood by those skilled in the art that various changes in form and details may be made therein without departing from the scope of the invention encompassed by the appended claims.

The invention claimed is:

1. A multi-layer device for connecting to an electrical unit enclosed within the multi-layer device, comprising:
    a first wafer having a surface bonded to a first insulator;
    a first outer terminal and a second outer terminal, wherein the first and the second outer terminals are isolated islands in the first wafer separated physically and electrically from the remainder of the first wafer by a set of trenches in the first wafer;
    said first insulator having a first surface bonded to the first wafer and a second surface bonded to a second wafer;
    a first inner thin-film terminal-coated on the second surface of the first insulator positioned on top surface of the second wafer;
    said second wafer having a first surface bonded to the second surface of the first insulator and a second surface bonded to a first surface of a second insulator;
    an interior sensor unit hermetically sealed within the second wafer and electrically isolated from remainder of the second wafer by a gap;
    said second insulator having a first surface bonded to a second surface of the second wafer and a second surface bonded to a third wafer;
    a second inner thin-film terminal coated on the first surface of the second insulator opposite to the first inner thin-film terminal on bottom surface of the second wafer, wherein both the first and the second inner terminals being electrically connected to the interior sensor unit, the first outer terminal (14) being electrically connected to the sensor unit from the top via the first inner terminal, the second outer terminal being electrically connected to the sensor unit from the bottom via the second inner terminal, the first and second outer terminals being adapted for connecting to an external electrical unit;
    said third wafer bonded to the second surface of the second insulator; and
    an insulating reinforcement included in the trenches and positioned adjacent to at least one of the first and second outer and inner terminals to provide for reinforcement of the at least one of the first and second outer and inner terminals to reduce mechanical loads to the terminals.

2. The device of claim 1, wherein the reinforcement reduces mechanical loads to the at least one of the first and second outer and inner terminals.

3. The device of claim 1, wherein the reinforcement is positioned to provide at least a partial encapsulation of the at least one of the first and second outer and inner terminals.

4. The device of claim 1, wherein the reinforcement reduces mechanical loads to the at least one of the first and second outer and inner terminals.

5. The device of claim 1, wherein the reinforcement provides improved electrical insulation of at least a portion of the at least one of the first and second outer and inner terminals.

6. The device of claim 1, wherein the reinforcement reduces a chance of contamination and a reduced potential of electrical shorts between at least two of the first and second outer and inner terminals.

7. The device of claim 1, wherein the reinforcement is positioned in a trench formed adjacent to the first and second outer and inner terminals.

8. The device of claim 1, wherein the reinforcement is made of glass.

9. The device of claim 1, wherein the reinforcement has a width of about 25-500 microns.

10. The device of claim 1, wherein the reinforcement has a height of about 50% to no more than 100% of the height of the first wafer.

11. The device of claim 1, wherein a first etch pit of the first insulator and a first etch pit of the second insulator are electrically connected to the first inner terminal and the second inner terminals, respectively.

12. The device of claim 11, wherein a first electrical path is formed from the first outer terminal through the first etch pit of the first insulator to the first inner terminal.

13. The device of claim 11, wherein the second wafer further includes a pillar electrically isolated from the remainder of the second wafer.

14. The device of claim 13, wherein a second etch pit of the first insulator and a second etch pit of the second insulator are electrically connected to the pillar, respectively.

15. The device of claim 14, wherein the third wafer further includes a cap electrically connected to the first etch pit and the second etch pit of the second insulator.

16. The device of claim 15, wherein a second electrical path is formed from the second outer terminal through the second etch pit of the first insulator to the pillar of the second wafer, continuing through the second etch pit of the second insulator, across the cap of the third wafer, up to the first etch pit of the second insulator, and finally to the second inner terminal.

* * * * *

UNITED STATES PATENT AND TRADEMARK OFFICE
CERTIFICATE OF CORRECTION

| | | |
|---|---|---|
| PATENT NO. | : 7,696,083 B2 | Page 1 of 1 |
| APPLICATION NO. | : 11/373520 | |
| DATED | : April 13, 2010 | |
| INVENTOR(S) | : Kwa | |

It is certified that error appears in the above-identified patent and that said Letters Patent is hereby corrected as shown below:

Title page item (73) Assignee should read as follows: Endevco Corporation, San Juan Capistrano, CA (US)

Signed and Sealed this

Twenty-fifth Day of January, 2011

David J. Kappos
*Director of the United States Patent and Trademark Office*